United States Patent [19]

Doan et al.

[11] Patent Number: 5,212,111
[45] Date of Patent: May 18, 1993

[54] LOCAL-OXIDATION OF SILICON (LOCOS) PROCESS USING CERAMIC BARRIER LAYER

[75] Inventors: Trung T. Doan; Gurtej S. Sandhu, both of Boise, Id.

[73] Assignee: Micron Technology, Inc., Boise, Id.

[21] Appl. No.: 872,015

[22] Filed: Apr. 22, 1992

[51] Int. Cl.5 .............................................. H01L 21/76
[52] U.S. Cl. ...................................... 437/70; 437/69; 437/28; 148/DIG. 106
[58] Field of Search ........................... 437/69, 70, 28; 148/DIG. 106

[56] References Cited

U.S. PATENT DOCUMENTS

| | | | |
|---|---|---|---|
| 4,110,899 | 9/1978 | Nagasawa et al. | 29/571 |
| 4,313,256 | 2/1982 | Widmann | 437/41 |
| 4,459,741 | 7/1984 | Schwabe et al. | 29/576 |
| 4,466,174 | 8/1984 | Darley et al. | 437/70 |
| 4,489,338 | 12/1984 | Voncken | 357/23 |
| 4,564,394 | 1/1986 | Bussmann | 437/69 |
| 4,657,630 | 4/1987 | Agatsuma | 156/643 |
| 4,675,982 | 6/1987 | Noble, Jr. et al. | 148/DIG. 106 |
| 4,679,303 | 7/1987 | Chen et al. | 437/20 |
| 4,685,198 | 8/1987 | Kawakita et al. | 437/73 |
| 4,746,963 | 5/1988 | Uchida et al. | 357/50 |
| 4,889,829 | 12/1989 | Kawai | 437/69 |
| 4,892,614 | 1/1990 | Chapman et al. | 437/67 |
| 4,909,897 | 3/1990 | Duncan | 437/61 |
| 4,963,505 | 10/1990 | Fujii et al. | 437/62 |
| 4,966,858 | 10/1990 | Masquelier et al. | 437/27 |
| 4,987,093 | 1/1991 | Teng et al. | 437/69 |
| 5,004,701 | 4/1991 | Motokawa | 437/69 |
| 5,091,332 | 2/1992 | Bohr et al. | 437/57 |

*Primary Examiner*—Brian E. Hearn
*Assistant Examiner*—Trung Dang
*Attorney, Agent, or Firm*—Stephen A. Gratton

[57] ABSTRACT

A local oxidation of silicon (LOCOS) process for semiconductor manufacture in which a barrier layer for the oxidation process and for a subsequent field implant is formed of a ceramic material. The ceramic material is one that can be easily deposited on silicon with low stress and is characterized by an ion stopping power greater than that of silicon nitride. Suitable ceramic materials include metal oxides, titanates, carbides, glasses and ferroelectrics.

16 Claims, 1 Drawing Sheet

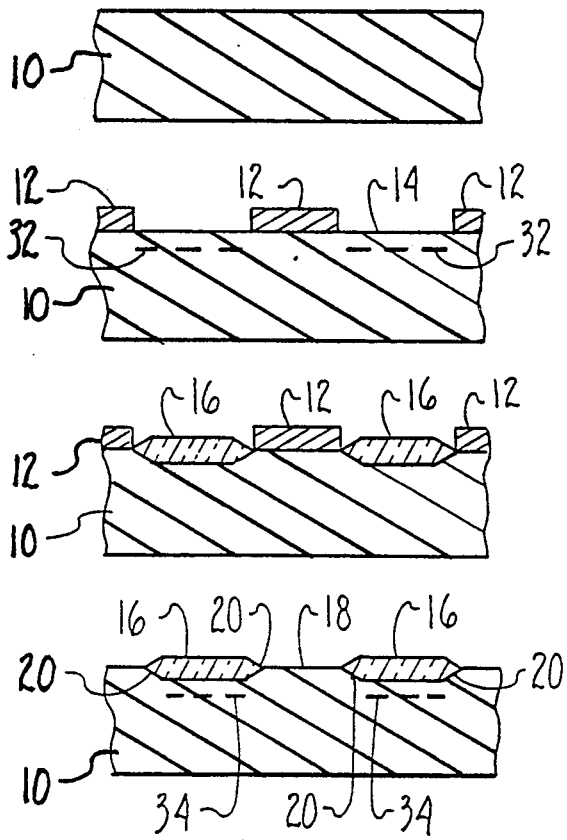
FIG. 1A (PRIOR ART)
FIG. 1B (PRIOR ART)
FIG. 1C (PRIOR ART)
FIG. 1D (PRIOR ART)
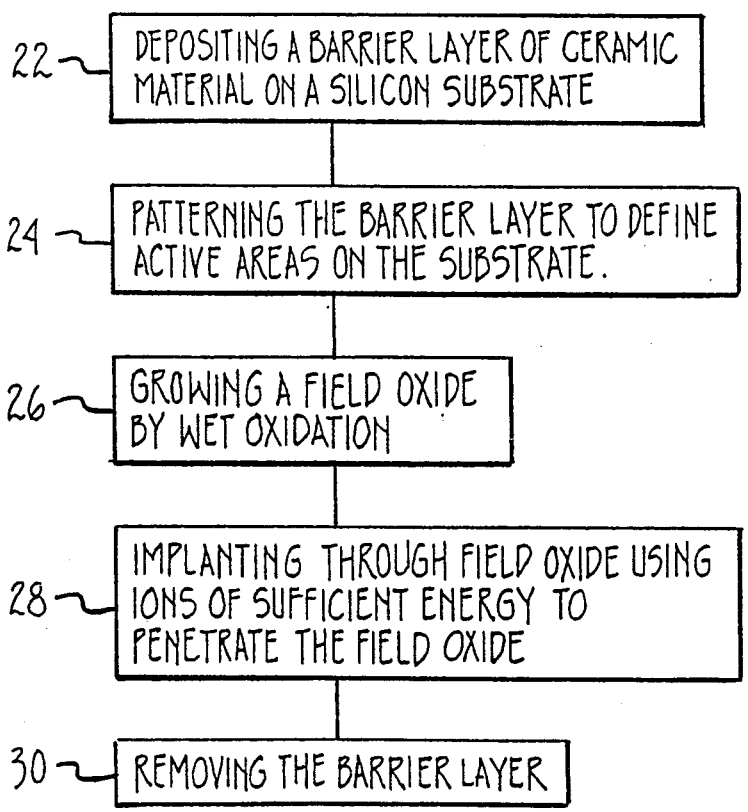
FIG. 2

LOCAL-OXIDATION OF SILICON (LOCOS) PROCESS USING CERAMIC BARRIER LAYER

TECHNICAL FIELD

This invention relates to semiconductor manufacture and more particularly to a semiconductor LOCOS process in which ceramic materials are utilized as a barrier layer.

BACKGROUND OF THE INVENTION

Microchip fabrication involves the formation of integrated circuits (ICs), on a semiconducting substrate. A large number of semiconductor devices or ICs are typically constructed on a monolithic substrate of a single crystal silicon material. The semiconductor devices are formed by various processes such as doing and patterning the substrate and depositing various conducting or insulating layers of material on the substrate.

One process used to separate the active regions on the silicon substrate is known as local oxidation of silicon (LOCOS). To perform LOCOS, a barrier material such as silicon nitride is deposited on the substrate. The barrier layer is then patterned and etched to expose the substrate in certain areas. The silicon substrate is then subjected to thermal oxidation. By exposing the uncovered or exposed areas of the silicon substrate to a high temperature oxidizing atmosphere, a relatively thick field oxide (FOX) is grown only in the exposed areas. The barrier material is then removed and the substrate may then be processed further for forming the semiconductor devices.

FIGS. 1A-1D illustrate such a LOCOS process. The process begins with a silicon substrate 10 (FIG. 1A). A layer of silicon nitride 12 is first deposited on the substrate 10 as a mask leaving exposed or unprotected areas 14 (FIG. 1B). The substrate 10 is then thermally oxidized with an oxidizing atmosphere such as steam to form a field oxide (FOX) 16 in the exposed areas 14 of the substrate 10 (FIG. 1C). The silicon nitride mask 12 is then removed and active semiconductor devices are formed in moat regions 18 of the substrate 10 (FIG. 1D). Each moat region 18 is separated by field oxide (FOX) 16. The field oxide (FOX) 16 thus functions to isolate the active devices of the completed semiconductor structure.

As shown in FIG. 1C, the field oxide (FOX) 16 grows not only vertically in the exposed areas 14 of the silicon substrate 10 but also laterally underneath the edges of the silicon nitride mask 12. This lateral oxide encroachment under the nitride mask 12 is known as the "bird's beak" 20. In general, the bird's beak 20 can grow to a thickness of about half the field oxide (FOX) 16 thickness.

The formation of the bird's beaks 20 reduces the moat region 18 available for the active semiconductor devices. This necessitates the formation of as thin as possible a field oxide (FOX) thickness. A reduced field oxide thickness, however, may degrade the circuit performance of the completed semiconductor devices. As an example, a thin field oxide may increase the interconnect capacitance between the semiconductor devices and allow leakage current under the field oxide and between the active semiconductor devices formed in adjacent moat areas 18.

These problems are compounded because there can be thousands of field oxide areas on a typical semiconductor die. In addition increased circuit densities require the formation of even thinner field oxides.

In the past, various semiconductor manufacturing processes have been proposed to improve the LOCOS process. U.S. Pat. No. 4,466,174 to Darley et al; U.S. Pat. No. 4,909,897 to Duncan; U.S. Pat. No. 4,313,256 to Widmann; U.S. Pat. No. 4,892,614 to Chapman et al; and U.S. Pat. No. 4,564,394 to Bussmann; disclose representative LOCOS processes that are stated to be improvements over the standard LOCOS process as shown in FIGS. 1A-1D.

In general, each of these processes, as well as the standard LOCOS process shown in FIGS. 1A-1D utilizes silicon nitride as a mask or barrier material to protect the moat areas during the oxidation process. Silicon nitride is favored in this application because it provides a good barrier to oxygen diffusion and has an adequate thermal expansion match with Silicon. Moreover silicon nitride can be easily deposited using a low pressure chemical vapor deposition process (LPCVD). With such a process silicon nitride is deposited from silane or dichlorosilane. The result is a film with the composition of $Si_3N_4$. Silicon oxide has also been utilized in this application but in general silicon nitride is preferred.

One problem associated with the use of silicon nitride is that because it's coefficient of thermal expansion does not exactly match that of silicon, high stresses may be induced in the silicon nitride film and particularly at the interface of the silicon and silicon nitride. Such high stresses can produce cracks or pinholes which limit the effectiveness of the barrier layer during the oxidation process. In addition, this limits the thickness of the silicon nitride to a relatively thin layer. Another limitation associated with silicon nitride as a barrier material is that it has a relatively low ion stopping power especially if it can only be formed in a relatively thin layer. Consequently following the LOCOS process the silicon nitride barrier layer must be removed and another mask material deposited for a subsequent field implant step for doping the field oxide (FOX).

The present invention is directed to the use of materials that exhibit improved performance characteristics over silicon nitride and silicon oxide as a barrier layer in a LOCOS process. Accordingly it is an object of the present invention to provide improved materials for use as a barrier layer in a semiconductor LOCOS process. It is a further object of the present invention to provide an improved LOCOS process and particularly an improved process for forming a barrier layer in a LOCOS process. It is a further object of the present invention to provide an improved LOCOS process wherein a material deposited as a barrier layer can also be utilized as a mask material in a subsequent field implant of the field oxide. It is a further object of the present invention to provide a LOCOS process wherein an ion implant can be performed after a field oxidation step thus eliminating lateral encroachment of ions during field oxidation.

SUMMARY OF THE INVENTION

In accordance with the present invention a LOCOS process is provided in which a barrier layer is formed of a material that can be deposited on silicon with low stress and can then be used as a mask material in a subsequent field implant step. The barrier layer can be formed of a material that is effective as a barrier to oxygen diffusion during LOCOS and as a barrier to ions during field implant of the field oxide. In addition, the barrier layer must be formed of a material that can be deposited on the silicon substrate with a low stress such that cracking can be eliminated.

In general, materials classified as ceramics satisfy these criteria. Ceramics are generally defined as inorganic nonmetallic materials. Ceramics exhibit dielectric or insulating properties and possess the aforementioned criteria for a barrier layer. Such materials include those classified as metal oxides, ferroelectrics, carbides, glasses, and titanates. Specific examples include $TiO_2$, $TaO_x$, $WO_x$, and $ZrO_x$. Such materials have a much higher ion stopping power than silicon nitride. With some materials this ion stopping power is almost three times greater than that of silicon nitride. This enables the ceramic barrier layer to be used as both the barrier layer during LOCOS and as a mask during ion implant of the field oxide. In addition the ion implant can be performed after rather than before field oxidation. These dual functions cannot be achieved with silicon nitride because the silicon nitride cannot be made thick enough to provide an effective ion block without high stress and cracking.

Other objects, advantages, and capabilities of the present invention will become more apparent as the description proceeds.

BRIEF DESCRIPTION OF THE DRAWINGS

FIGS. 1A-1D are schematic diagrams of a semiconductor structure showing a prior art LOCOS process; and FIG. 2 is a flow diagram of the process of the invention.

DESCRIPTION OF PREFERRED EMBODIMENTS

With reference to FIG. 2, a LOCOS process in accordance with the invention is shown. The LOCOS process, generally stated, uses a ceramic material other than silicon nitride to form the barrier layer. The ceramic material is one that can be easily deposited on silicon with low stress and has a higher ion stopping power than silicon nitride so that it can also be used as a mask in a subsequent field implant of the field oxide.

More particularly stated the process of the invention includes the steps of:

depositing a barrier layer of a ceramic material on a silicon substrate, step 22;

patterning the barrier layer to define the active areas on the substrate, step 24;

growing a field oxide in the active areas by wet oxidation step 26;

implanting the active areas using ions of sufficient energy to penetrate the field oxide, step 28; and removing the barrier layer from the active areas by dry or wet etching, step 30.

Depositing the barrier layer of a ceramic material, step 22, is preferably accomplished by chemical vapor deposition (CVD) or sputtering. In general a ceramic material such as those previously listed, can be easily deposited upon silicon and have a coefficient of thermal expansion which closely matches that of silicon. This enables the ceramic material to be deposited on the silicon with a low stress. In addition, some ceramic materials have an ion stopping power that is up to several times (i.e. 3X) that of silicon nitride. In addition to the materials previously specified the following materials are also suitable for this application $Al_2O_3$, $CrO_x$, $Ba_xT_iO_x$, $Ba_xSr_xCuO_x$. As an example, the barrier layer of ceramic material can be deposited to a thickness in the range of 500Å to 5000Å.

Patterning the barrier layer to define the active areas on the substrate, step 24, can be accomplished by standard lithographic techniques. This may include deposition of a photosensitive material, (i.e. a resist), followed by photopatterning and etching. Etching forms openings through the barrier layer to the substrate and exposes the silicon in these areas. The exposed areas of the substrate are the areas on which the field oxide will subsequently be grown. The areas on the substrate protected by the barrier layer define the moat areas where the active semiconductor devices will ultimately be formed. This is essentially the same process as shown in FIG. 1B. The ceramic material or barrier layer is denoted by reference numerals 12. The openings to the substrate are denoted by reference numeral 14.

Growing a field oxide (FOX) in the exposed areas 18, step 26, can be accomplished in a wet oxygen atmosphere. This is essentially the process shown in FIG. 1C with the field oxide 16 forming in the exposed areas 14 of the substrate. As an example the field oxide 16 can be grown in a wet oxygen atmosphere at about 800°-1200° C. for about 6-10 hours. This forms a field oxide that is approximately 2000Å to 6000Å thick.

Less lateral encroachment of the field implant will occur in a subsequent field implant step because field ion implant is performed after growing the (FOX). Normally (FOX) is grown after field ion implant Implanted atoms then diffuse during the (FOX) step resulting in lateral encroachment. This improvement over the prior art is illustrated in FIGS. 1B and 1D. FIG. 1B illustrates a prior art process in which ions 32 are implanted in unprotected areas 14 prior to (FOX). These implanted ions may cause diffusion and lateral encroachment during growth of the (FOX) 16 (FIG. 1C). With the present process ion implantation occurs after growth of the (FOX) 16 in the area of the substrate 10 below the (FOX) 16 (FIG. 1D). In FIG. 1D, these ions are indicated by reference numeral 34.

In addition to less lateral encroachment a subsequent planarization step of the active semiconductor devices is simplified because the moat regions 18 are not recessed as far from a top surface of the field oxide (FOX) 16.

Implanting the field oxide areas 16, step 28, can be accomplished using standard ion implantation equipment and ionization chambers. The exact process will depend on the device requirements. As an example, high energy boron implants may be used to define field isolation between n-transistors, and phosphorus implants may be used to define field isolation between p-transistor devices. The high stopping power of the ceramic barrier layer will permit a higher dopant fluency to be utilized with a minimal amount of lateral encroachment of the field implant in the substrate under the ceramic layer.

Following field implantation, the ceramic barrier layer can be removed. Removing the ceramic barrier layer, step 30, can be accomplished by either a wet etching process (i.e. chemical etchants) or a dry etching process (plasma etching). Suitable wet etchants for ceramic materials include $H_2SO_4$, $NH_4OH$, $H_2O_2$, $HNO_3$. Suitable dry etchant gases for ceramic materials include $SF_6$, $CF_4$.

Thus the process of the invention provides a simple yet unobvious method for performing a LOCOS process in semiconductor manufacture and for performing a subsequent field implant using a single barrier layer formed of a ceramic material. In summary the process of the invention offers the following advantages over the equivalent prior art semiconductor manufacturing processes:

1. Fewer process steps are required because the ceramic barrier layer for the LOCOS process functions as a mask for a field implant of the field oxide.
2. Process limitations associated with the high stress of silicon nitride as a barrier layer are alleviated.
3. Problems associated with field implant encroachment are alleviated.
4. A thinner field oxide can be used since a higher dopant fluency can be used with less lateral encroachment and with simplification of subsequent planarization steps.

While the method of the invention has been described with reference to a preferred embodiment thereof, as will be apparent to those skilled in the art, certain changes and modifications can be made without departing from the scope of the invention as defined by the following claims.

What is claimed is:

1. A local oxidation of silicon (LOCOS) process for semiconductor manufacture comprising:
   depositing a low stress barrier layer of a ceramic material having a high ion stopping power on a silicon substrate;
   patterning and etching the barrier layer to define active areas on the substrate covered with the ceramic material with exposed areas of the substrate therebetween;
   growing a field oxide in the exposed areas by wet oxidation;
   implanting the active areas through the field oxide using ions of sufficient energy to penetrate the field oxide but not the barrier layer; and
   removing the ceramic layer.

2. The process as recited in claim 1 and wherein:
   the ceramic material is a titanate.

3. The process as recited in claim 1 and wherein:
   the ceramic material is a ferroelectric material.

4. The process as recited in claim 1 and wherein:
   the ceramic material is a glass.

5. The process as recited in claim 1 and wherein:
   the ceramic material is a carbide.

6. The process as recited in claim 1 and wherein:
   consisting of $TiO_2$, $TaO_x$, $WO_x$, and $ZrO_x$.

7. The process as recited in clair. 1 and wherein:
   the ceramic material is deposited by chemical vapor deposition (CVD).

8. The process as recited in claim 1 and wherein:
   the ceramic material is removed by a wet etch.

9. The process as recited in claim 1 and wherein:
   the ceramic material is removed by a dry etch.

10. A local oxidation of silicon (LOCOS) process for semiconductor manufacture comprising:
    depositing a barrier layer on a silicon substrate with the barrier layer formed of a ceramic material having a higher ion stopping power than silicon nitride and having a coefficient of thermal expansion that closely matches that of silicon such that it can be deposited with low stress;
    photopatterning and etching the ceramic barrier layer such that exposed areas are formed on the substrate for a field oxide and active areas on the substrate for active devices are covered with the ceramic barrier layer;
    growing the field oxide in the exposed areas by wet oxidation;
    implanting the active areas through the field oxide using ions of sufficient energy to penetrate the field oxide but not the ceramic barrier layer; and
    removing the ceramic barrier layer by etching.

11. The process as recited in claim 10 and wherein:
    the ceramic material is selected from the group consisting of a metal oxide, a titanate, a carbide, a glass, or a ferroelectric.

12. The process as recited in claim 11 and wherein:
    the ceramic material has an ion stopping power approximately 3X that of silicon nitride.

13. The process as recited in claim 10 and wherein:
    the ceramic material is deposited by (CVD).

14. The process as recited in claim 10 and wherein:
    the ceramic material is deposited by sputtering.

15. The process as recited in claim 10 and wherein:
    the ceramic material is deposited to a thickness of between 500Å to 5000Å.

16. The process as recited in claim 10 and wherein:
    the field oxide is grown to a thickness of between 2000Å to 6000Å.

* * * * *